(12) United States Patent
Maier et al.

(10) Patent No.: US 11,686,802 B2
(45) Date of Patent: Jun. 27, 2023

(54) METHOD AND MAGNETIC RESONANCE APPARATUS FOR DIFFUSION IMAGE ACQUISITION WITH MOTION OFFSETTING AND NAVIGATION-DEPENDENT SEGMENTATION

(71) Applicant: Stephan Maier, Chestnut Hill, MA (US)

(72) Inventors: Stephan Ernst Maier, Askim (SE); Jens Johansson, Gothenburg (SE)

( * ) Notice: Subject to any disclaimer, the term of this patent is extended or adjusted under 35 U.S.C. 154(b) by 0 days.

(21) Appl. No.: 17/454,752

(22) Filed: Nov. 12, 2021

(65) Prior Publication Data
US 2023/0152406 A1    May 18, 2023

(51) Int. Cl.
| G01V 3/00 | (2006.01) |
| G01R 33/563 | (2006.01) |
| G01R 33/48 | (2006.01) |
| G01R 33/565 | (2006.01) |
| G01R 33/561 | (2006.01) |

(52) U.S. Cl.
CPC ... *G01R 33/56341* (2013.01); *G01R 33/4818* (2013.01); *G01R 33/5617* (2013.01); *G01R 33/56509* (2013.01)

(58) Field of Classification Search
CPC .............. G01R 33/3415; G01R 33/543; G01R 33/5659; G01R 33/36; A61B 5/055
USPC .......................................................... 324/309
See application file for complete search history.

(56) References Cited

U.S. PATENT DOCUMENTS

| 5,786,692 | A | 7/1998 | Maier |
| 71,324 | A1 | 4/2004 | Norris |
| 237,057 | A1 | 10/2005 | Porter |
| 7,804,299 | B2 | 9/2010 | Reeder |
| 9,760,979 | B2 | 9/2017 | Chen |
| 10,302,729 | B2 | 5/2019 | Stemmer |
| 377,050 | A1 | 12/2019 | Ennis |
| 10,649,056 | B2 | 5/2020 | Bi |
| 10,677,870 | B2 | 6/2020 | Ennis |
| 2007/0096733 | A1* | 5/2007 | Arunachalam .... G01R 33/5611 324/309 |
| 2008/0275329 | A1* | 11/2008 | Reeder ............. G01R 33/56341 600/410 |

(Continued)

FOREIGN PATENT DOCUMENTS

| DE | 3557275 | 10/2019 |
| WO | WO-2005073748 A1 * | 8/2005 ........... G01R 33/445 |
| WO | WO-2017132180 A1 * | 8/2017 ........... G01R 33/561 |

OTHER PUBLICATIONS

Ordidge RJ et al. Correction of motional artifacts in diffusion-weighted MR images using navigator echoes. Magn Reson Imaging. 1994;12(3):455-60. Elsevier, Inc., Amsterdam, Netherlands.

(Continued)

*Primary Examiner* — Walter L Lindsay, Jr.
*Assistant Examiner* — Frederick Wenderoth

(57) ABSTRACT

The present invention relates to the locally resolved examination of objects by means of magnetic resonance (MR) and relates specifically to a less motion-artifact prone method for navigated multi-shot acquisition of diffusion-weighted image data using moment-nulled magnetic field gradients for diffusion encoding. The invention further relates to an apparatus for performing the method.

15 Claims, 7 Drawing Sheets

(56) References Cited

U.S. PATENT DOCUMENTS

| | | | |
|---|---|---|---|
| 2009/0058419 A1* | 3/2009 | Kabasawa | G01R 33/56341 324/309 |
| 2013/0181712 A1* | 7/2013 | Sutton | G01R 33/5676 324/314 |
| 2015/0369891 A1* | 12/2015 | Miyazaki | G01R 33/5617 324/309 |
| 2018/0017650 A1* | 1/2018 | de Oliveira | G01R 33/4818 |

OTHER PUBLICATIONS

Anderson AW et al. Analysis and correction of motion artifacts in diffusion weighted imaging. Magn. Reson. Med. Sep. 1994;(32), 379-387. John Wiley & Sons, Inc., Hoboken, New Jersey.

Brockstedt S et al. Use of an enhanced gradient system for diffusion MR imaging with motion-artifact reduction. Acta Radiol. Nov. 1995,36(6):662-70. SAGE Publications, Inc., Thousand Oaks, California.

Clark CA et al. Improved reduction of motion artifacts in diffusion imaging using navigator echoes and velocity compensation. J Magn Reson. Feb. 2000;142(2):358-63. Elsevier, Inc., Amsterdam, Netherlands.

Butts K et al. Diffusion-weighted interleaved echo-planar imaging with a pair of orthogonal navigator echoes. Magn Reson Med. May 1996;35(5):763-70. John Wiley & Sons, Inc., Hoboken, New Jersey.

Atkinson D et al. Nonlinear phase correction of navigated multi-coil diffusion images. Magn Reson Med. Nov. 2006,56(5):1135-9. John Wiley & Sons, Inc., Hoboken, New Jersey.

Turner et al. Echo-planar imaging of diffusion and perfusion. Magn Reson Med. Nov. 1990;19(2), 247-53. John Wiley & Sons, Inc., Hoboken, New Jersey.

Jezzard P et al. Characterization of and correction for eddy current artifacts in echo planar diffusion imaging. Magn Reson Med. May 1998;39(5):801-12. John Wiley & Sons, Inc., Hoboken, New Jersey.

Aliotta E et al. Convex optimized diffusion encoding (CODE) gradient waveforms for minimum echo time and bulk motion-compensated diffusion-weighted MRI. Magn Reson Med. Feb. 2017;77(2):717-729. John Wiley & Sons, Inc., Hoboken, New Jersey.

Peña-Nogales Ó et al. Optimized Diffusion-Weighting Gradient Waveform Design (ODGD) formulation for motion compensation and concomitant gradient nulling. Magn Reson Med. Feb. 2019;81(2):989-1003. John Wiley & Sons, Inc., Hoboken, New Jersey.

Diiorio G et al. Large angle spin-echo imaging Magn Reson Imaging. 1995;13(1):39-44. John Wiley & Sons, Inc., Hoboken, New Jersey.

Alexander AL et al. Elimination of eddy current artifacts in diffusion-weighted echo-planar images: the use of bipolar gradients. Magn Reson Med. Dec. 1997;38(6):1016-21. John Wiley & Sons, Inc., Hoboken, New Jersey.

Chan RW et al. Characterization and correction of eddy-current artifacts in unipolar and bipolar diffusion sequences using magnetic field monitoring. J Magn Reson. Jul. 2014;244:74-84. Elsevier, Inc., Amsterdam, Netherlands.

Golay X et al. High-resolution isotropic 3D diffusion tensor imaging of the human brain. Magn Reson Med. May 2002;47(5):837-43 John Wiley & Sons, Inc., Hoboken, New Jersey.

Cervantes B et al. Isotropic resolution diffusion tensor imaging of lumbosacral and sciatic nerves using a phase-corrected diffusion-prepared 3D turbo spin echo. Magn Reson Med. Aug. 2018;80(2):609-618. John Wiley & Sons, Inc., Hoboken, New Jersey.

Eager D at al. Beyond velocity and acceleration: jerk, snap and higher derivatives. Eur J Phys. Oct. 13, 2016;37. 11 pages. IOP Publishing, Bristol, United Kingdom.

Barker AJ et al. Analysis of complex cardiovascular flow with three-component acceleration-encoded MRI. Magn Reson Med. Jan. 2012;67(1):50-61 John Wiley & Sons, Inc., Hoboken, New Jersey.

Kaso A et al. Motion-insensitive diffusion imaging of the brain using optical tracking and dynamic sequence updates. Magn Reson Med. Aug. 2021;86(2):926-934. John Wiley & Sons, Inc., Hoboken, New Jersey.

* cited by examiner

METHOD AND MAGNETIC RESONANCE APPARATUS FOR DIFFUSION IMAGE ACQUISITION WITH MOTION OFFSETTING AND NAVIGATION-DEPENDENT SEGMENTATION

BACKGROUND OF THE INVENTION

The field of the invention is nuclear magnetic resonance imaging (MRI) methods and systems. More particularly, the invention relates to MR diffusion weighted imaging (DWI). Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the gyromagnetic constant gamma of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net longitudinal magnetization $M_0$ arises in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net longitudinal magnetization, $M_0$, may be rotated, or "tipped" into the x-y plane to produce a net transverse magnetic moment $M_{xy}$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance (NMR) phenomenon is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct an "MR" image using one of many well-known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$ but which have a gradient along the respective x, y and z axes. By controlling the strength of these gradients during each NMR cycle, the spatial distribution of spin excitation can be controlled and the location of the resulting NMR signals can be identified. MR imaging is widely employed to image samples and a number of anatomical and physiological features in humans and animals. Moreover, diffusion-weighted imaging (DWI) is a powerful MRI technique for probing microscopic tissue structure.

SUMMARY OF THE PRIOR ART

With regard to diffusion and its measurement using magnetic resonance, it will be recognized that in a pure liquid such as water at room temperature, the individual water molecules are in constant motion due to the phenomenon of thermal agitation. This phenomenon is commonly referred to as "Brownian motion". The so-called "diffusion coefficient" (herein sometimes referred to as "D") is a measure of this molecular motion, and it can be determined with magnetic resonance techniques.

More particularly, a magnetic field gradient can be used to "tag" atomic level spins in a sample according to their location in space at the time of the application of a first magnetic gradient to the sample. A second gradient, applied at a later time, then serves to probe how far, on average, the individual spins have moved between the time of the first gradient application and the time of the second gradient application. In the ideal case, these magnetic field gradients are applied in brief, strong bursts separated by a common well-defined time period. In practice in clinical magnetic resonance systems, however, the gradients are applied for a moderate duration of several milliseconds or several tens of milliseconds, and the leading edges of the respective bursts are separated by delays of similar, but slightly longer duration.

Referring to FIG. 1, diffusion weighting of the acquired NMR signal is provided by gradients on each side of a 180° radiofrequency (RF) refocusing pulse. The first and second diffusion gradient lobes are of equal polarity, amplitude, and size (area). Their relative amplitude values along respective axes can be changed to measure diffusion in different directions. The timing parameters δ and Δ refer to the duration of the diffusion gradient pulses and to the separation of their leading edges, respectively. Under these conditions, the diffusion encoding level, i.e., the so-called "b-factor", is defined by the following relationship:

$$b=\gamma^2 G^2 \delta^2 (\Delta-\gamma/3)$$

where γ is the gyromagnetic ratio (42.58 MHz/Tesla for protons) and G is the magnetic field gradient amplitude. The diffusion-encoding gradient waveforms are usually optimized for short duration within the constraints of desired diffusion encoding and apparatus-specific gradient amplitude and slew rate limitations. The short duration ensures shortest possible echo time with maximum attainable signal-to-noise ratio (SNR).

In an experiment with one gradient pulse placed prior to and the other following the 180° RF inversion pulse of a spin echo sequence (90° RF slice select—TE/2—180° RF inversion—TE/2—signal acquisition), the signal S of the spin-echo measured at echo time TE for isotropic diffusion in a simple diffusion environment like a liquid is given by a mono-exponential relationship:

$$S(b)=S_0 exp(-bD).$$

In this relationship, $S_0$ depends upon machine constants, the spin-spin relaxation time $T_2$, the spin-lattice relaxation time $T_1$ in any experiment that repeats measurements every repetition time period TR, and the spin density p. Specifically, the diffusion coefficient D may be measured by making multiple measurements of S as a function of b, plotting the natural logarithm of S vs. b and then performing a linear regression whose slope provides the experimental measurement of D. Alternatively and preferably, a non-linear least-square regression analysis can be used to directly infer the fitting exponential function without performing the logarithm operation. The value of b is most conveniently varied by keeping the gradient timings fixed and incrementing the amplitude G of the magnetic field gradient.

It was quickly realized that in certain organs like the brain, preferred directions of water diffusion exist. More particularly, diffusion along one direction, as selected by the direction of the magnetic field gradient vector could be different than the diffusion along another direction. In the brain, this lack of isotropy of the diffusion coefficient (the so-called "diffusion anisotropy") was, and is, attributed to the presence of nerve fiber tracts along which water is more free to move than it is in directions perpendicular to these tracts. Indeed, in the light of the phenomenon of restricted or anisotropic diffusion, it generally is agreed in the art that at least three orthogonal directions of the diffusion sensitization gradient (which are independent of the preferred directional diffusion) should be sampled to generate trace images, i.e., maps of a rotationally invariant measure of diffusion. Further, a minimum of six directions must be sampled for each voxel, to determine the preferred direction of diffusion with the diffusion tensor formalism. More advanced formalisms have been developed for use with acquisition protocols that sample much more than six directions. This approach can be useful to detect the presence and orientation of crossing fibers.

A DWI pulse sequence suitable for single-shot diffusion imaging is shown in FIG. 2. It includes the generation of a spatially and spectrally selective 90° RF excitation pulse 8 which is produced in the presence of a multi-polar pulse group 6 to excite spins in a 2 D slice. A 180° RF refocusing pulse 21 is produced in the presence of a slice select gradient pulse 22 to refocus the transverse magnetization. The refocusing pulse is preceded by dephasing gradient pulses 16, 18, and 20 along each of the three gradient axes. Immediately after the refocusing pulse follow rephasing gradient pulses 24, 26, and 28 along each of the three gradient axes. These dephasing and rephasing pulses are required if the MR scan includes the acquisition of images without or with very low diffusion weighting. Diffusion weighting of the NMR signal along each of the respective axes is provided by gradients 10, 12 and 14 immediately after the 90° RF excitation pulse and by gradients 30, 32 and 34 immediately after the rephasing pulses 24, 26, and 28. After the completion of the diffusion encoding, gradient pulse 44 along the read direction and gradient pulse 46 along phase encoding direction dephase the signal so that under the influence of read gradient pulses 48 and phase encode pulses 50 all echo signals 52 to reconstruct the 2D image are collected in a single shot. After the echoes have been received, optional crusher gradient signals 54, 56, and 58 can be applied respectively.

There are a large number of clinically and scientifically important applications for DWI that relate to tissue water diffusion. These include early detection and characterization of cytotoxic edema caused by cerebral infarction, improved tumor characterization through detection of restricted diffusion within a cellular tumor, and cerebral "tractography" for fiber angle mapping of the cerebral white matter, as well as many others. Within the abdomen, low b-value DWI is commonly used for liver imaging, to cancel the signal from flowing blood in order to improve the conspicuity of liver lesions such as metastases or primary liver tumors.

Diffusion weighted imaging is exquisitely sensitive to motion. Large phase shifts from small involuntary patient bulk motion result during the application of diffusion sensitizing gradients with high amplitude and long duration. The movement of a rigid body can be described completely by the provision of the translation vector and the rotation vector. A separation of the phase shifts related to each respective motion vector is helpful to better understand their disturbing effect on the reconstructed image. Object translation introduces a uniform phase shift according to $$\varphi(x, y, z) = \gamma \int \vec{G}(t) \cdot \vec{r}(t) dt$$

where $\vec{G}(t)$ describes the time course of the diffusion gradient (with reversed sign for times prior to the RF refocusing pulse) and $\vec{r}(t)$ the time dependent translation vector. Accordingly, given the mono-polar diffusion gradient configuration shown in FIG. 1, the phase shift $\varphi$ introduced by an object translation with constant velocity v that shares the same direction as applied magnetic field gradient equals:

$$\varphi = v \gamma G \delta \Delta$$

With typical gradient configurations employed in diffusion imaging experiments, velocities as small as 1 mm/s and below are sufficient to induce 180° phase shifts. Obviously, higher order motion terms, such as acceleration, jerk, etc., also contribute to the observed phase shifts.

Object rotation introduces a linear phase shift gradient orthogonal to the rotation axis and the gradient encoding direction. The phase shift is given by $$\varphi(x, y, z) = \gamma \cdot \vec{r}_0 \int \vec{G}(t) \times \vec{\theta}(t) dt$$

where $\vec{r}_0$ describes the position with reference to the center of rotation and $\vec{\theta}(t)$ the time dependent rotation vector.

Tissue deformation, caused by cardio-vascular pulsations, respiration, or muscle contraction is another source of phase shifts. These phase shifts occur locally and can to some extent be mitigated by timing the acquisition with electrocardiogram (ECG) or respiratory gating.

Many MRI pulse sequences rely on multiple excitations and signal acquisitions in order to form a complete k-space matrix prior to Fourier transformation. It should be noted that without diffusion weighting, phase shifts and associated artifacts that result from patient movement during such multi-shot sequences are typically not significant. With diffusion imaging, however, the shot-to-shot variations of motion-related phase shifts severely interfere with spatial encoding and lead to pronounced ghosting and blurring artifacts. The prior art has investigated several approaches of multi-shot diffusion imaging that rely on mitigation and correction of shot-to-shot phase variations.

The earliest approach used a second refocusing RF pulse to generate a navigator echo along the readout direction. This navigator echo was used to determine and correct residual zeroth order phase shifts, i.e., only phase shifts related to translation. This was followed by an approach that extended the use of this 1D navigator by also correcting first order phase shifts, i.e., phase shifts related to rotation. Despite such correction, for axial brain scans the reduction of ghosting artifacts was basically only effective with diffusion encoding along the phase encode direction. Subsequent research showed the benefit of combining navigation along the readout direction with velocity compensated diffusion encoding gradients. Although this approach is effective at eliminating velocity related phase shifts, the low performance of the magnetic field gradients available at the time resulted in rather long duration gradient pulses with pronounced sensitivity for higher order motion terms. Another approach shown in FIG. 3 attained appreciably improved results without velocity compensated gradients by using orthogonal navigator trajectories 36 and 40 along the phase encode and readout direction, respectively. The resulting navigator signals 38 and 42 were used to perform a zeroth order phase correction and a first order phase correction along the phase encode and readout direction, respectively. Slice selection occurred with a basic slice selective 90° RF pulse 9 in the presence of a slice select gradient pulse 7. A segmented rectilinear k-space trajectory for accelerated readout was used instead of the single line k-space trajectory that was employed in the earlier approaches. Moreover, the k-space trajectory followed the navigator without interposed refocusing RF pulse. All of these early attempts at improving multi-shot DWI relied on ECG gating to attain a minimum level of acceptable image quality.

In the subsequent development it was shown how such 1D navigator correction can be incorporated into the hardware of an MR system. A major breakthrough for navigated multi-shot diffusion imaging was the introduction of 2D navigator trajectories that are collected after a refocusing RF pulse. This permitted not only correction the correction of zeroth and first order phase changes, but also of local phase changes caused by tissue deformation. This made multi-shot DWI without ECG gating practical. The most recent advance called multiplexed sensitivity encoding, relies on self-navigation using the echo that is collected for imaging and parallel coil acceleration. Attempts have been made to expand spatial encoding to a 3D volume for improved SNR, generally by using a thin slab acquisition, such that phase variations across the slab are small and can be ignored.

From the onset of DWI pulse sequence development for practical use in human subjects, there has been the quest to entirely avoid multi-shot sampling. In this way, ghosting and blurring artifacts that result from shot-to-shot phase variations can be completely eliminated. One such method, which poses only modest requirements for gradient hardware, is line scan diffusion imaging. This method sacrifices multi-shot 2D spatial encoding for single shot 1D read-outs along sequentially excited parallel columns. Early on, however, it was recognized that a read-out trajectory covering the complete k-space matrix for an image in a single shot would be the preferred solution for inherently robust and rapid diffusion imaging. With the widespread availability of magnetic field gradients that provide the high slew rates required for rapid k-space traversal, single-shot diffusion imaging with an echo-planar imaging (EPI) readout as presented in FIG. 2 has found broad clinical application. However, EPI suffers from inferior spatial resolution, global and local distortions caused by eddy currents and local susceptibility variations, and blurring caused by the $T_2^*$ signal decay during the long readout. To address all these deficiencies, but also to perform a 3D acquisition, a segmented, i.e., multi-shot approach is required.

It should be recognized that artifacts caused by diffusion sensitization also occur with single-shot EPI diffusion sequences; the linear phase shift gradient that arises during rotation causes the signal echo to shift in k-space, which can lead to a complete signal loss. This happens more frequently with partial echo sampling, a technique that is used to attain a shorter echo time for improved SNR. Moreover, non-uniform tissue deformation can lead to localized signal loss. Particularly for abdominal and heart diffusion imaging this has been an obstacle which spurred further development to eliminate phase artifacts at the source, i.e., by using motion compensated diffusion sensitizing gradients.

The sensitivity of a gradient pulse to motion of order n is given by the moment integral according $$\vec{M}_n = \int \vec{G}(t) \cdot t^n dt$$

The basic and most commonly used diffusion encoding gradient waveform as shown in FIG. 1 relies on mono-polar gradient pulses of equal duration and amplitude on each side of the refocusing 180° RF pulse. After applying this gradient waveform, stationary spins experience no phase shift and therefore the zeroth order moment M0 is zero. The first order moment M1 and all higher order moments are non-zero. The simplest motion-compensated diffusion encoding gradient waveform is shown in FIG. 4 and consists of bipolar pulses of equal duration and amplitude on each side of the refocusing 180° RF pulse. This arrangement only results in nulling of M0 and the velocity associated moment M1. The MOCO gradient waveform shown in FIG. 5 is the preferred setup for motion-compensated diffusion encoding, since it efficiently achieves nulling of M0, the velocity associated moment M1, and the acceleration associated moment M2.

More time-efficient diffusion encoding with M0=M1=M2=0 can be attained with optimized solutions where the gradient pulses on either side of the refocusing pulse are non-symmetrical and non-identical. Such gradient waveforms are preferable, provided the programming environment of the apparatus provides means to install such pulses. An optimization framework to develop such pulses has been presented.

The application of a gradient field leads to the generation of concomitant magnetic fields as described by the higher order terms of Maxwell's equations. Concomitant fields are not typically an issue in diffusion weighted imaging because the M0 terms on each side of the refocusing pulse cancel out when diffusion encoding gradient waveforms are identical on either side of a refocusing pulse. However, with gradient waveforms that are not symmetrical or identical on either side of a refocusing pulse, the concomitant fields must be considered in order to attain M0=0. The M1 or M2 moment nulling of motion compensated waveforms applies only to the iso-center. At very high gradient amplitudes the concomitant gradient fields can introduce small, but significant M1 and M2 terms that grow with off-center distance.

Such motion-compensated diffusion encoding gradient waveforms have been successfully applied in single-shot sequences to obtain largely artifact-free diffusion-weighted images and accurate diffusion coefficient maps of the brain, liver and even moving heart. In particular, it was demonstrated that signal voids that result with conventional mono-polar gradient waveforms in areas of transitory tissue rotation or deformation are effectively eliminated with such motion-compensated gradient waveforms. Thus the purpose of motion-compensated diffusion encoding has been to reduce intra-voxel phase dispersion and related signal loss in areas of non-uniform motion. The reduction of shot-to-shot variations of motion induced phase changes is also substantial but not relevant, since these methods rely on single-shot imaging, where phase coherence between shots is not required.

It has been shown that motion-compensated diffusion encoding gradient waveforms can be integrated into preparation sequences of longitudinal magnetization. Images of the longitudinal magnetization can then be generated with conventional imaging sequences, including multi-shot 3D sequences. This approach is inherently robust and requires no phase correction because motion-related phase shifts introduced by the diffusion-encoding gradients are only present during the preparation step. Compared to the conventional diffusion preparation with direct readout of the transversal magnetization the number of RF pulses is doubled, i.e., the preparation sequence requires an initial 90° RF pulse, two 180° refocusing RF pulses, and a final 90° RF pulse to flip back the magnetization vector. This significantly increases the amount of power deposited by the RF field, which will limit the rapid repeated application of the preparation sequence.

SUMMARY OF THE INVENTION

The present invention exploits the significant reduction of motion-induced phase changes that can be attained with motion-compensated diffusion encoding waveforms for segmented multi-shot diffusion imaging with optional navigation-based phase correction along two or three spatial encoding directions. It has been shown that 1D navigation along the spatial encoding directions is useful to perform segmented diffusion imaging. Such 1D navigation correction is limited to phase changes caused by rigid body translation and rotation and does not result in optimal image quality. Only the correction of local phase changes due to non-uniform tissue deformation will result in optimal image quality. Non-uniform tissue deformation is not only caused by direct muscle contraction, but also by pulsatile expansion of blood vessels. Correction of the consequential spatially non-linear phase changes requires a 2D navigator for 2D encoded multi-shot diffusion imaging and a 3D navigator for 3D encoded multi-shot diffusion imaging. A 3D navigator with sufficient coverage that provides adequate spatial detail in phase information is inherently difficult to implement. The invention is based on the assumption that these local phase changes caused by tissue deformation can sufficiently be offset by motion-compensated diffusion encoding alone. This is especially the case if higher order motion compensated diffusion encoding gradients, such as velocity and acceleration-compensated diffusion encoding gradients, are applied. Any residual zeroth order and first order phase variations caused by rigid body motion can be corrected by simple navigators, such as 1D navigators along each of the spatial encoding directions. These short duration k-space trajectories for navigation are preferably performed immediately after the k-space trajectory for imaging without interposed refocusing pulse.

Indeed it can be argued that this concept is more fail-proof than a 2D-navigator, where rotational rigid body movement can lead to a shift of the echo peak outside the limited k-space sampled by the navigator with complete signal loss and consequential inability to perform navigation. With motion-compensated diffusion encoding, the resulting echo peak shift will be smaller and the 1D navigator can readily sample a longer segment of k-space. Since 1D navigation can be performed sequentially along respective encoding directions, without interposed refocusing pulses, there are, unlike the transition from 2D to 3D navigators, no technical difficulties extending the 1D navigation along two directions for 2D imaging to 1D navigation along three directions for 3D imaging. Importantly, particularly when considering a 3D acquisition, the acquisition can be optimized for maximum SNR by using rapid excitation with a flip angle that is larger than 90°. A high-resolution 3D acquisition can advantageously be combined with motion monitoring and retrospective reconstruction-based correction of shot-to-shot dislocations that occur during the scan. The invention is fully compatible with acceleration methods, like parallel coil imaging and compressed sensing. This can be particularly advantageous when performing phase encoding along a third direction.

Figure 1:
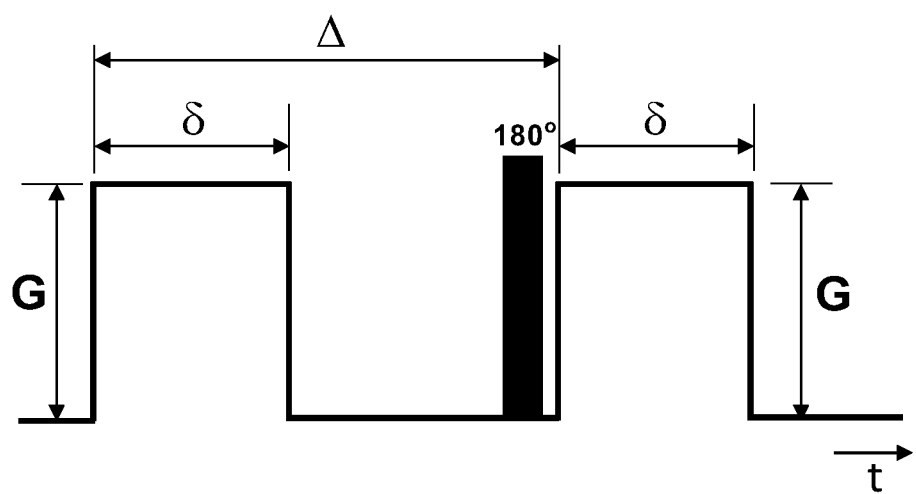
FIG. 1 is a time diagram of a basic diffusion-weighting preparatory experiment without motion compensation.
Figure 2:
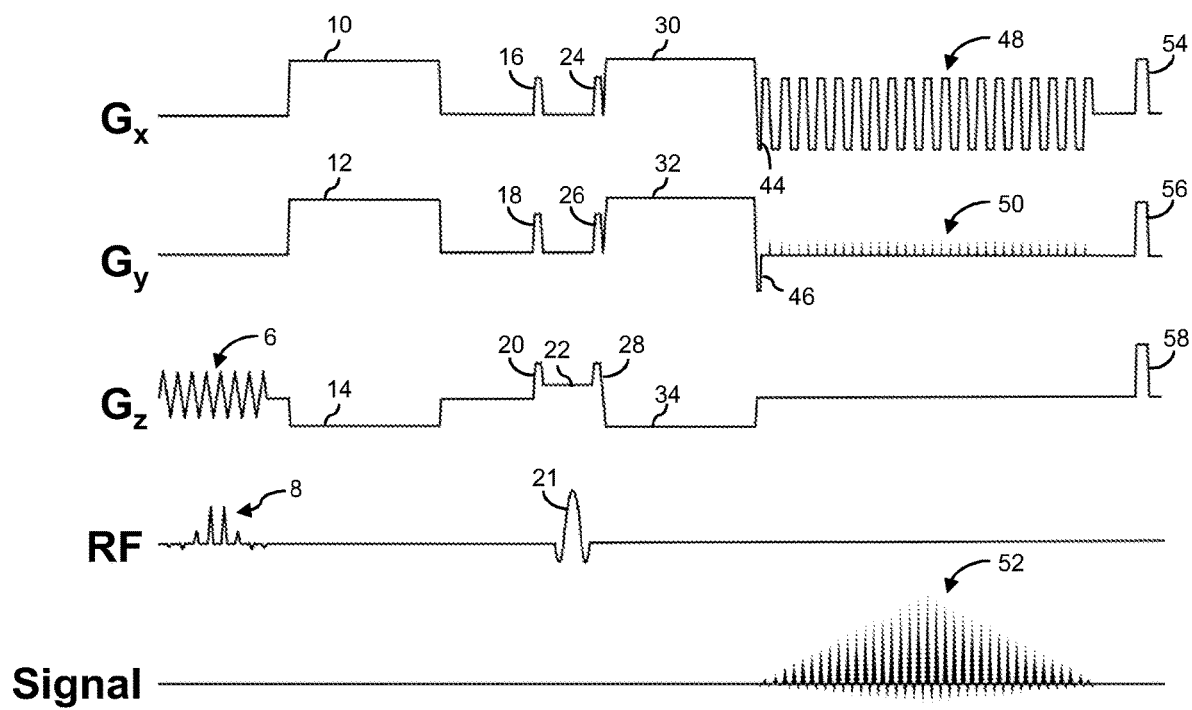
FIG. 2 shows in one diagram over a common time axis the sequence of magnetic field pulses, radiofrequency pulses, and acquired radiofrequency signals for image formation based on a prior art pulse sequence design for a single-shot 2D echo-planar readout using a basic diffusion-weighting preparation without motion compensation as shown in FIG. 1.

It may be mentioned that the illustrated time diagrams are not drawn to scale, i.e. the individual time sections and the amplitudes are not drawn in accordance with their actual mutual size ratios.

DETAILED DESCRIPTION OF THE INVENTION

The invention relies on diffusion encoding gradient pulses with motion compensation. Such gradient pulses are inherently less efficient in achieving diffusion encoding, which for given maximum gradient amplitude implies longer encoding time and higher sensitivity to uncompensated higher order motion terms. To decrease the sensitivity to uncompensated higher order motion terms it is beneficial employ higher gradient amplitudes. Thus, the invention is particularly applicable on systems with ultra-high gradient performance, where sequences with motion-compensated diffusion encoding can be realized at comparably short echo times. A b-factor in the order of 1000 s/mm$^2$ is used for the majority of clinical brain diffusion imaging protocols and on a state-of-the-art system, timings of $\delta$=20 ms and $\Delta$=30 ms can typically be realized with mono-polar gradients. The table below compares gradient amplitude and resulting motion sensitivities of this setup with those for motion-compensated diffusion encoding with equal gradient duration and separation.

| b = 1000 s/mm$^2$, $\delta$ = 20 ms, $\Delta$ = 30 ms | Mono-polar | Bipolar | MOCO ($\delta_1$ = 7 ms, $\delta_2$ = 13 ms) |
|---|---|---|---|
| G (mT/m) | 38.7 | 102.4 | 120.3 |
| M1 motion sensitivity* (mm/s/180°) | 0.5 | None | None |
| M2 motion sensitivity* (mm/s$^2$/180°) | 10 | 19 | None |
| M3 motion sensitivity* (mm/s$^3$/180°) | 230 | 255 | 1026 |

*Smaller numbers imply higher motion sensitivity

It is known that with partial echo sampling in cooperative normal subjects, involuntary head rotation in the presence of mono-polar diffusion encoding gradient waveforms can result in echo peak shifts that lead to complete signal loss. This implies velocity gradients that introduce phase gradients that exceed many-fold 180° across the field of view. From this observation it can be estimated that involuntary head motion involves velocities up to and beyond 10 mm/s. With this velocity number and magnetic resonance imaging measurements of blood flow acceleration in humans it is estimated that acceleration develops up to and beyond 100 mm/s$^2$. From other physical measurements of human motion it is estimated that such velocity and acceleration generates jerk of up to and beyond 1000 mm/s$^3$. Accordingly and referring to the motion sensitivity numbers of the table above, it is expected that substantial phase shifts can result, even with the offsetting of first and second order motion-related phase shifts. If not corrected for, these phase shifts would produce significant artifacts in multi-shot diffusion-weighted imaging.

The proposed innovation can be used with bipolar or MOCO gradient waveforms for diffusion encoding. The use of MOCO gradient waveforms with M0=M1=M2=0 is preferred, but for equal b-factor and equal maximum gradient amplitude it comes at a slight expense in time efficiency. The more time-efficient, numerically optimized diffusion encoding solutions with M0=M1=M2=0, where the gradient pulses on either side of the refocusing pulse are non-symmetrical and non-identical, should be used, however, if the programming environment of the apparatus provides means to install and execute such pulses.

The proposed pulse sequence invention offers several advantages over existing solutions for improved diffusion magnetic resonance imaging. The simplified navigation with 1D navigators is fast and readily incorporated with the standard multi-shot echo-planar readout without the need for generation of a separate echo by means of a refocusing pulse. Unlike methods that rely on self-navigated multiplexed sensitivity encoding, there is no inherent limitation of the segmentation factor, which warrants better distortion suppression. A segmented volume, i.e., segmented 3D acquisition is possible with the simple addition of phase encoding gradients and a 1D navigator along the same direction. Such approach can advantageously be integrated with techniques for motion monitoring and correction of body location changes that occur during the scan. Unlike multi-slice based approaches for compensation of body location changes, the excitation location and the spatial encoding directions do not need to be updated in real-time, since the correction can be applied retrospectively to the 3D k-space data.

The pulse sequence invention is fully compatible with acceleration methods, like parallel coil imaging and compressed sensing. Particularly, with a second phase encoding direction that is sampled over multiple separate excitations it can be considered beneficial to achieve a shorter scan time with parallel coil and compressed sensing acceleration along the second phase encode direction. The repeated excitation for 3D sampling can be optimized for maximum SNR by using a large angle excitation with the flip angle set to the supplement angle of the tissue-specific Ernst-angle $$\alpha_E = \arccos\left(e^{-\frac{TR}{T_1}}\right)$$

where TR equals the repetition time and $T_1$ the tissue-specific longitudinal relaxation time. For example, with a 250 ms TR excitation, using a 149° RF flip angle optimized for the 1600 ms $T_1$ of white matter at 3 T, the relative SNR compared to infinite TR is 0.28, which constitutes a 100% improvement over the use of a 90° RF flip angle, for which relative SNR is only 0.14. Hence, the use of a standard 90° RF flip angle would require four averages to attain the same SNR. In brain applications, rapid repeat excitation can also be beneficial to significantly suppress the signal of cerebrospinal fluid, which is a nuisance signal in images generated at long repetition times with conventional multi-slice scans. It is important to note that the application of 3D diffusion imaging with longitudinal magnetization preparation sequences at short repetition times would not permit RF flip angle optimization and would result in undesirably high RF power deposition.

The use of gradient coils capable of generating very high magnetic field gradients can increase eddy currents and associated geometric distortions. An inherent advantage of multi-polar diffusion encoding waveforms for motion-compensation is the reduction of eddy currents. Also, the use of a segmented multi-shot scan will reduce resulting distortions in proportion with the segmentation factor.

Figure 6:
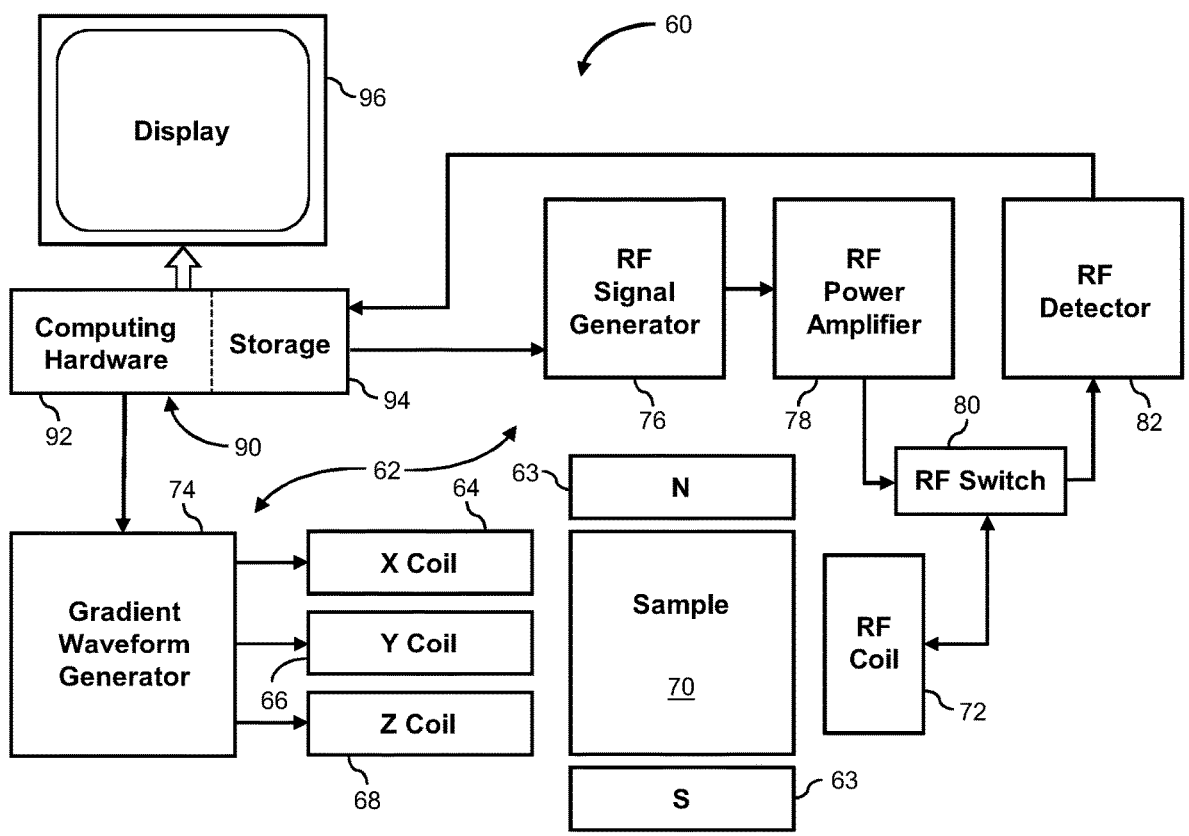
FIG. 6 is a high-level block diagram of an illustrative embodiment of a magnetic resonance imaging system suitable for use in the method of present invention.
Figure 7:
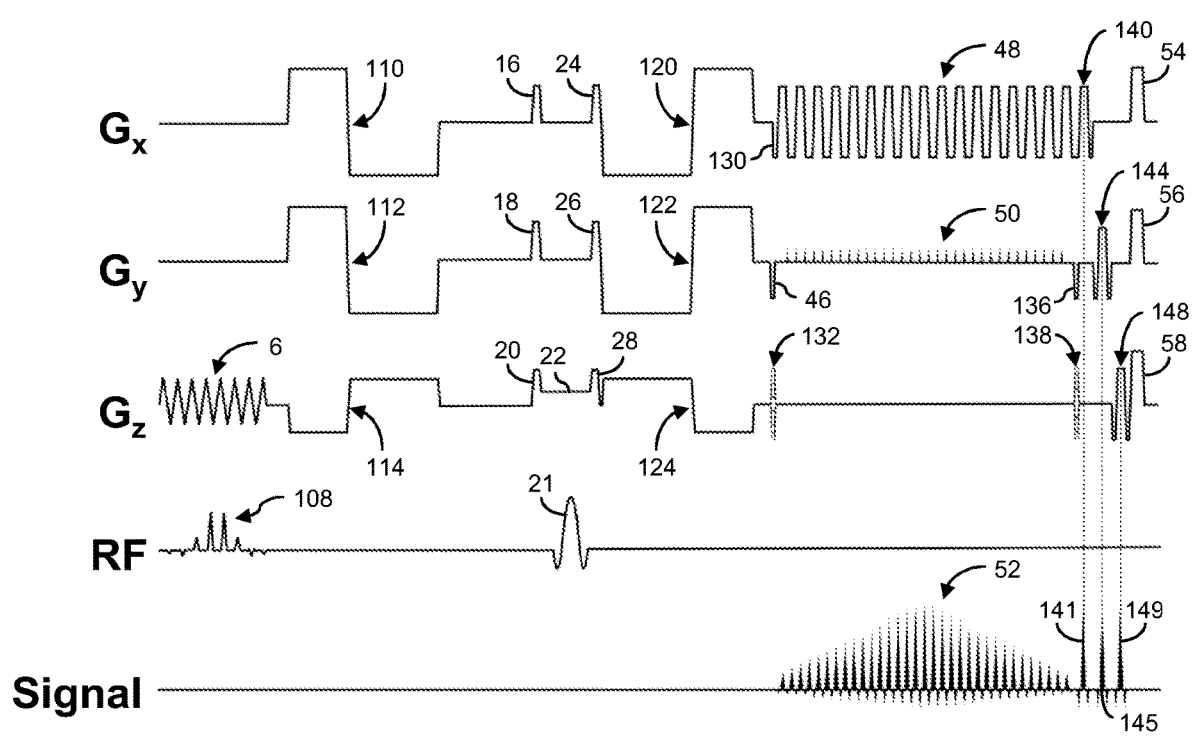
FIG. 7 shows in one diagram over a common time axis the sequence of magnetic field pulses, radiofrequency pulses, and acquired radiofrequency signals for image formation and navigator correction based on a pulse sequence design for segmented 2D or 3D echo-planar signal readout using a diffusion-weighting preparation with first and second order motion compensation as shown in FIG. 5.

An apparatus and pulse sequence suitable for the practice of this invention, as will be seen from FIGS. 6 and 7, includes a magnetic resonance imaging system 60, generally having a magnet assembly, interface circuitry, and a computer 90. The magnet assembly includes a very strong magnet 63 that creates a homogeneous magnetic field within and around a sample (e.g. an inert sample or patient). X, Y, and Z magnetic field gradient coils 64, 66, and 68 also form a part of the assembly and are positioned proximate or surrounding the sample 70. The assembly further comprises one or more RF coils 72, which are positioned near or around the sample.

The interface circuitry 62 includes a gradient waveform generator 74 with a control input connected to the computer and signal outputs connected to the gradient coils 64, 66, and 68, as well as an RF signal generator 76 with a control input connected to the computer and an output connected to an input of an RF power amplifier 78. The RF power amplifier has an output connected to an input of an RF switch 80. The RF switch has an output connected to the RF coil 72 and an output connected to the input of an RF detector 82.

The computer 90 includes computing hardware 92 and storage 94. The computing hardware can comprise special purpose hard-wired computing circuitry dedicated to magnetic resonance acquisition and image reconstruction, as well as a special programmed general purpose computer for display and user interaction. The storage 94 can include various types of storage, such as disk storage and random access memory. The storage can be used to store data and programs, including programs used to interact with the system's interface circuitry 62. The computer has a video output for providing video signals to a display 96, as well as control outputs connected respectively to control inputs of the gradient waveform generator 74 and the RF signal generator 76. The computer also has acquisition input operatively connected to an output of the RF detector 82.

In operation, referring to FIGS. 6 and 7, the imaging system 60 builds images under the control of the computer 90 according to a multi-shot echo-planar imaging (EPI) sequence. At the beginning of an acquisition sequence for an image, the computer 90 sends a signal to the RF signal generator 76, which responds by generating a spatially and spectrally selective pulse 108 with a flip angle of 90° or greater. This pulse is amplified by the RF power amplifier 78 and provided to the RF coil 72 via the RF switch 80. As this pulse is being provided, the computer instructs the gradient waveform generator 74 to drive the Z coil 68 with a multi-polar pulse group 6.

Next, the gradient waveform generator 74 provides a set of gradient pulse groups 110, 112, and 114 for the first part of motion-compensated diffusion encoding respectively to the X, Y, and Z gradient coils 64, 66, and 68. After the falling edge of the diffusion gradient signals and a wait time, which is inserted if needed to center the echo refocusing for the readout process, the gradient waveform generator 74 provides a set of dephasing gradient pulses 16, 18, and 20 respectively to the X, Y, and Z gradient coils 64, 66, and 68. Subsequently, a spatially selective 180° refocusing pulse 21 is provided to the RF coil 72, in much the same way that the spatial-spectral selective pulse was. At the same time, the gradient waveform generator provides a rectangular pulse 22 on the Z gradient coil. Then, the gradient waveform generator 74 provides a set of rephasing gradient pulses 24, 26, and 28 of same amplitude and duration as the dephasing gradient pulses respectively to the X, Y, and Z gradient coils 64, 66, and 68. Then, the waveform generator provides a set of gradient signals 120, 122, and 124 for the second part of motion-compensated diffusion encoding respectively to the X, Y, and Z gradient coils 64, 66 and 68. Both parts of the motion encoding gradient signals to the X, Y, and Z gradient coils are scaled to attain a desired diffusion weighting and diffusion encoding direction.

Once the gradient signals for motion-compensated diffusion encoding are turned off, the gradient waveform generator provides a set of dephasing gradient pulses 130, 46, and 132 respectively to the X, Y, and Z gradient coils 64, 66 and 68. With each new shot, the amplitude of the dephasing gradient pulse 46 is incremented or decremented according to the multi-shot sampling pattern. The dephasing gradient pulse 132 is only used in the case of 3D encoding and is varied according to the sampling pattern along the second phase encoding direction. Then the gradient waveform generator provides gradient pulse group 48 on the X coil 64 for spatial encoding along the frequency encoding direction and at the same time gradient pulse group 50 on the Y coil 66 for spatial encoding along the first phase encoding direction. As a result of this excitation sequence, a train of echoes 52 is received from the slice or volume that was excited by the spatial-spectral selective RF pulse and the 180° RF pulse. The RF coil receives these echoes and provides them via the RF switch 80 to the RF detector, from where the digitized signals are forwarded to the data storage 94. After completion of the last readout gradient pulse of gradient pulse group 48, the gradient waveform generator provides a set of rephasing gradient pulses 136 and 138 respectively to the Y, and Z gradient coils 66 and 68. The amplitude and duration of rephasing gradient pulse 136 is set so that the gradient time integral from the beginning of gradient pulse 46 to the end of gradient pulse 136 equals zero. Meanwhile, the rephasing gradient pulse 138 is of same magnitude and duration, but of opposite polarity as the dephasing gradient pulse 132. The rephasing gradient pulse 138 is only used in the case of 3D encoding.

After completion of the rephasing gradient pulses, the gradient waveform generator provides sequentially gradient pulse groups 140, 144, and 148 respectively to the X, Y, and Z gradient coils 64, 66 and 68. Each of these gradient pulse groups is characterized by a net zero time integral. The rephasing pulse that is required after completion of gradient pulse group 48 is preferably overlapped with the first gradient pulse of gradient pulse group 140. The sequential application of gradient pulse groups 140, 144, and 148 gives rise to sequential echoes 141, 145, and 149, respectively. The RF coil receives these 1D encoded echoes and provides them via the RF switch 80 to the RF detector, from where the digitized signals are forwarded to the data storage 94. After the echoes have been received, optional crusher gradient signals 54, 56, and 58 can be applied respectively to the X, Y, and Z gradient coils 64, 66 and 68. The computer 90 processes the signal data of the image echoes 52, and navigator echoes 141, 145, 149. Image reconstruction can be completed after acquiring all k-space data of a diffusion encoding and then images for this diffusion encoding can be displayed on the display 96.

Figure 3:
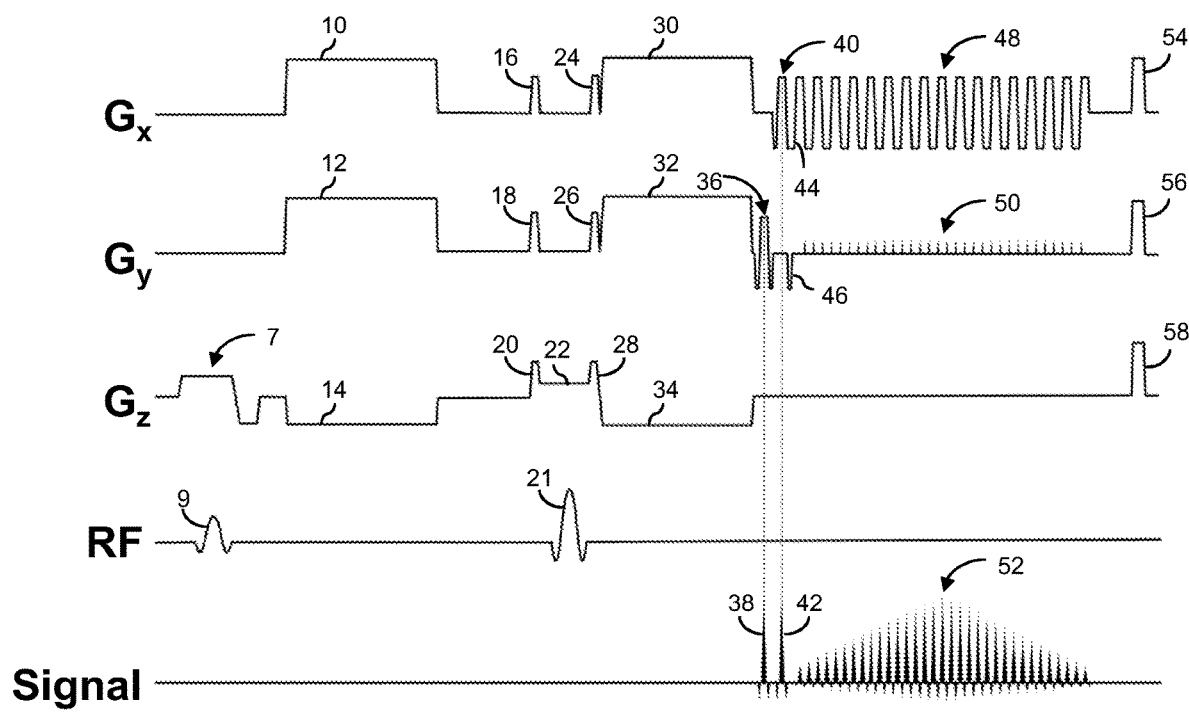
FIG. 3 shows in one diagram over a common time axis the sequence of magnetic field pulses, radiofrequency pulses, and acquired radiofrequency signals for navigator correction and image formation based on a prior art pulse sequence design for segmented 2D echo-planar readout using a basic diffusion-weighting preparation without motion compensation as shown in FIG. 1.
Figure 4:
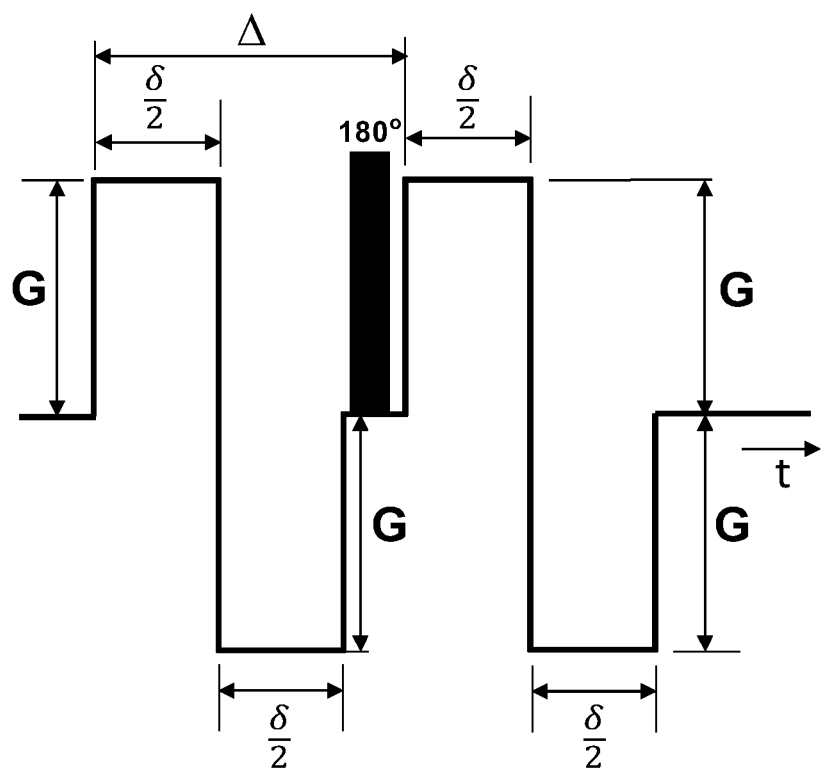
FIG. 4 is a time diagram of a diffusion-weighting preparatory experiment with first order motion compensation.
Figure 5:
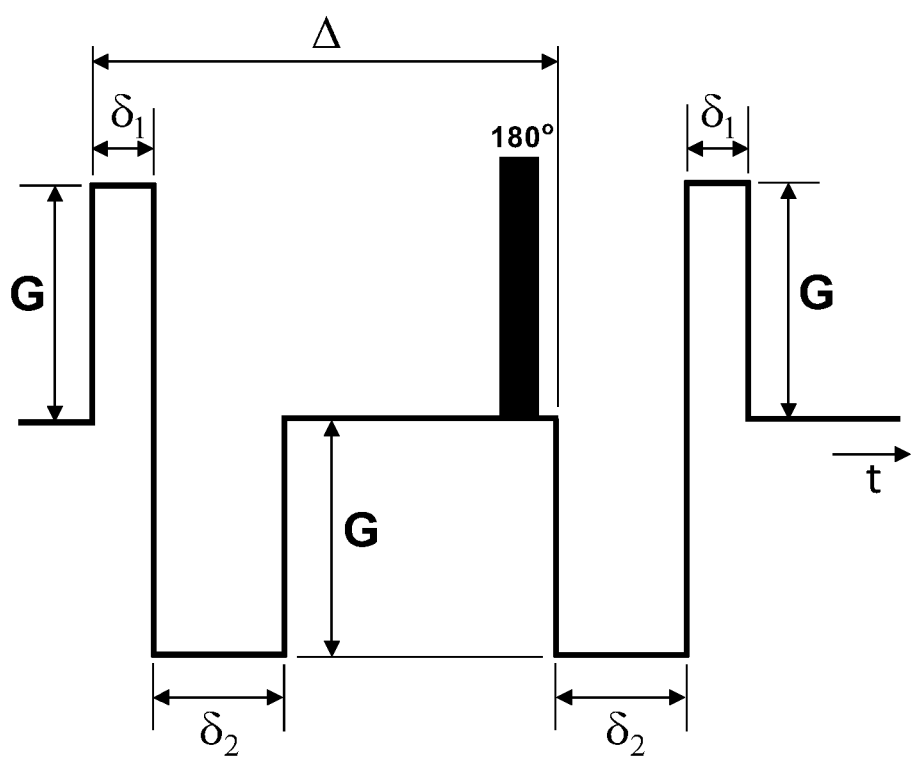
FIG. 5 is a time diagram of a diffusion-weighting preparatory experiment with first and second order motion compensation.

The new pulse sequence design as presented in FIG. 7 places the 1D navigator echoes towards the end of the sequence before applying the crusher gradient pulses 54, 56, and 58. This placement is preferable, since the prior art placement before the readout as presented in FIG. 3 delays the train of echoes 52 and requires a commensurate addition of wait time before the refocusing 180° RF pulse. This results in a longer echo time and consequently lower SNR.

The acquisition proceeds to obtain data for other segments and, if the option is used, for other phase encoding steps along the third encoding direction. The exemplary k-space trajectory shown in FIG. 7 is advantageous for the reconstruction process, but other k-space trajectories for imaging and navigation, including non-rectilinear k-space trajectories, and k-space trajectories suitable for self-navigation may be considered. This includes also sampling trajectories that span over a plurality of spin-echoes within one shot.

Scanning can be performed sequentially for a plurality of diffusion encoding gradient waveforms, a plurality of diffusion encoding gradient amplitudes and a plurality of diffusion encoding directions. These acquisition steps can be performed in arbitrary order, but typically the diffusion gradient amplitude or diffusion encoding direction is changed after completing the acquisition of all k-space data of a slice or volume. However, in order to distribute the load on the gradient power amplifier over time, it may be of interest to complete the acquisition of all amplitudes and directions for one segment and, moreover, to alternate between low and high amplitudes, before proceeding to the acquisition of the next segment.

After the completion of sampling all k-space data for one diffusion encoding setting, reconstruction of image data pertaining to this part of the acquisition can be initiated. The processing of a segmented acquisition with phase correction is well described in the MRI literature. The following describes one, but not unique way to perform such processing.

In a first step, all navigator signals are analyzed to determine the necessary zeroth and first order phase correction. The first order phase shift along each respective encoding direction is obtained by measuring the echo peak position with respect to the center of each gradient pulse group used to encode the 1D navigator echo. The echo peak position can be estimated by fitting a symmetric function with a single positive peak, such as a parabola or the modulus of a shifted Sinc function to the modulus of the 1D echo signal. The modulus or magnitude M of the received 1D echo signal may be determined at any sampled point by the square root of the sum of the squares of the I and Q components of the complex signal:

$$M = \sqrt{I^2 + Q^2}$$

After fitting and finding the shift of the peak position, the 1D navigator signal is Fourier transformed into image space and the phase is determined for each position along the profile as follows:

$$\varphi = arctan(Q/I)$$

The phase profile in image space is linearly adjusted so that according to the Fourier Shift Theorem, which relates a linear phase in image space to a shift in k-space, the echo peak determined through fitting is shifted to the center of the sampling window. Any residual shift is estimated by fitting a line to the so corrected phase profile via a linear regression weighted by the magnitude of the points along the image space profile. This may require the application of a phase unwrapping algorithm prior to fitting the line. The slope of the fitted line is used to adjust the estimated shift of the echo peak. The first order phase correction term $\varphi_1$ for motion induced phase errors can then be determined according to the Fourier Shift Theorem from this adjusted echo peak shift value. The zeroth order phase correction term $\varphi_0$ for motion induced phase errors equals the constant term of the line fit applied to the phase profile in image space. The first order phase correction term is determined for each navigator of each shot. The zeroth order phase correction term should ideally be the same for all navigators within a shot, but differences may arise due to eddy currents. Thus it is advisable to use the zeroth order phase correction term of one specific navigator only.

The estimation of motion related phase errors for each shot is followed by the actual image reconstruction. The echo signals sampled along the frequency encoding direction x can be directly Fourier transformed. Subsequently the phase $\varphi(x, j)$ for each spatial position x and each shot j is computed. The zeroth and first order phase term that was obtained with the analysis of the navigator signal along the frequency encoding direction of respective shot j is used to obtain the corrected phase $\varphi_c(x, j)$ by simple subtraction:

$$\varphi_c(x, j) = \varphi(x, j) - (\varphi_{0,x}(j) + x\varphi_{1,x}(j))$$

The correction for linear phase shifts determined with the phase-encode navigator profiles is more complicated. According the Fourier Shift Theorem the slope $\varphi_{1,y}(j)$ of the y-navigator phase profile predicts the error $dk_y$ in the $k_y$-space positions for all the echoes acquired in the corresponding shot. Analogously, if phase encoding along a second direction is performed, the slope $\varphi_{1,z}(j)$ of the z-navigator phase profile predicts the error $dk_z$ in the $k_z$-space positions for all the echoes acquired in the corresponding shot. Because the shifts are fractions of a sample point and vary from shot to shot, the data are not actually on a regular grid in respective phase-encode direction, which precludes a discrete Fourier transform. One way to deal with this is to interpolate the k-space data to the Cartesian grid by convolution with a weighted kernel function prior to performing the discrete Fourier transform. Another approach that is preferable, provided sufficient computing resources are available, is the inversion of the experimental image gradient encoding matrix that results from the incorporation of the adjusted k-space positions. This is possible since the measured k-space values for a single column of $k_y$-space signal data, $S(k_y,x)$, together with the adjusted encoding matrix, $E(k_y+dk_y,y)$, can be used to compute the ideal diffusion-weighted proton density distribution through $$\varrho(y_1 \ldots y_n, x) = S(k_{y1} \ldots k_{yn}, x) E^{-1}(k_y + dk_y, y)$$

with the encoding matrix being given by $$E = \begin{bmatrix} \exp(-2\pi(k_{y1}+dk_{y1})y_1) & \ldots & \exp(-2\pi(k_{yn}+dk_{yn})y_1) \\ \vdots & \ddots & \vdots \\ \exp(-2\pi(k_{y1}+dk_{y1})y_n) & \ldots & \exp(-2\pi(k_{yn}+dk_{yn})y_n) \end{bmatrix}$$

This operation can be performed analogously and independently for all $k_z$-space signal data.

In conclusion, embodiments of the invention can provide a new and highly practical technique to allow high-resolution DWI with high spatial fidelity and SNR, as well as minimal blurring. In contrast to segmentation methods that rely on 2D navigation, the present method is compatible with simplified 1D navigation, which does not require formation of a separate spin echo. Unlike multiplexed sensitivity-encoding, the segmentation factor is not limited. The method can be used for segmented acquisition in 3D, which can yield substantially better SNR and which is compatible with techniques for correction of body location changes during the scan. As such, it should find broad applications in clinical applications and neuroscience investigations of detailed brain microstructures, where high spatial resolution is required.

One skilled in the art will readily appreciate that the present invention is well adapted to carry out the objects and obtain the ends and advantages mentioned, as well as those inherent therein. The present disclosures described herein are presently representative of preferred embodiments, are exemplary, and are not intended as limitations on the scope of the invention. Changes therein and other uses will occur to those skilled in the art which are encompassed within the spirit of the invention as defined by the scope of the claims.

The invention claimed is:

1. A method for producing a diffusion-weighted image with a magnetic resonance imaging system, the steps comprising:
   a) providing a selective radiofrequency (RF) excitation to produce transverse magnetization within a volume;
   b) computing and generating a first of two magnetic field waveforms of a first and second order moment nulled diffusion encoding gradient;
   c) providing a selective RF refocusing pulse;
   d) computing and generating a second of two magnetic field waveforms of said first and second order moment nulled diffusion encoding gradient;
   e) performing a signal readout of the transverse magnetization along a varying k-space trajectory for a segment of a k-space matrix of an image;
   f) performing a repetition of steps a) to e) as necessary to acquire the signals for all segments of said k-space matrix; and
   g) processing said k-space matrix data to obtain said diffusion-weighted image.

2. A magnetic resonance imaging apparatus, comprising:
   a) a computer-controlled RF signal generator, RF amplifier, and RF coils and a computer-controlled gradient waveform generator and magnetic field gradient coils for providing a selective radiofrequency (RF) excitation to produce transverse magnetization within a volume;
   b) a computer-controlled gradient waveform generator and magnetic field gradient coils for providing a first of two waveforms of a first and second order moment nulled diffusion encoding gradient;

c) a computer-controlled RF signal generator, RF amplifier, and RF coils and a computer-controlled gradient waveform generator and magnetic field gradient coils for providing a selective RF refocusing pulse;

d) a computer-controlled gradient waveform generator and magnetic field gradient coils for providing a second of two waveforms of said first and second order moment nulled diffusion encoding gradient;

e) a computer-controlled gradient waveform generator, magnetic field gradient coils, RF coils, and an RF detector linked to computer storage for performing a signal readout of the transverse magnetization along a varying k-space trajectory for a segment of a k-space matrix of an image;

f) a computer routine for performing a repetition of steps a) to e) as necessary to acquire the signals for all segments of said k-space matrix; and g) a computer for processing said k-space matrix data to obtain said diffusion-weighted image.

3. An apparatus for carrying out magnetic resonance imaging of a sample within a volume, said apparatus comprising an MRI machine and a control system that controls said MRI machine, wherein said MRI machine includes:
a signal generator, said signal generator being an RF signal generator,
an RF coil disposed to be in communication with said volume,
first, second, and third gradient coils,
a gradient waveform generator configured to cause said gradient coils to support corresponding magnetic field gradients within said volume, and
wherein said control system is configured to acquire all segments of a k-space matrix of said image and to obtain a diffusion-weighted image based on said k-space matrix by, for each of said segments:
causing said signal generator and said gradient waveform generator to provide a selective RF excitation to produce a transverse magnetization with said volume to be used for signal readout along a varying k-space trajectory for a segment of said k-space matrix of said image,
causing said gradient waveform generator to provide a first computed waveform to said gradient coils,
causing said signal generator and said gradient waveform generator to provide a selective RF refocusing pulse,
causing said gradient waveform generator to provide a second computed waveform,
wherein said first and second waveforms are waveforms of a first and second order moment nulled diffusion encoding gradient, and
wherein said control system is further configured to use said matrix to provide said information representative of said image to said user.

4. The magnetic resonance imaging method of claim 1, wherein said varying k-space trajectory comprises several parts with interposed refocusing pulses.

5. The magnetic resonance imaging method of claim 1, wherein each said signal readout further comprises a signal readout along an unvarying k-space trajectory and wherein from said signal readout along an unvarying k-space trajectory a navigator signal is derived and its characteristic is used as information for the correction of image artifacts which are produced by movement of the object.

6. The magnetic resonance imaging method of claim 5, wherein said unvarying k-space trajectory further comprises rectilinear k-space trajectories that pass through the k-space center and wherein said rectilinear k-space trajectories are along each of the encoding axes.

7. The magnetic resonance imaging method of claim 6, wherein said rectilinear k-space trajectories used for encoding navigator signals are traversed after the varying k-space trajectory used for imaging.

8. The magnetic resonance imaging method of claim 7, wherein said k-space matrix is a 2D matrix.

9. The magnetic resonance imaging method of claim 7, wherein said k-space matrix is a 3D matrix.

10. The magnetic resonance imaging method of claim 9, wherein said repetition is performed with a specific repetition time and wherein said RF excitation for producing transverse magnetization uses an RF flip angle that is equal or close to the supplement of the tissue specific Ernst Angle for said specific repetition time.

11. The magnetic resonance imaging method of claim 5, wherein said varying k-space trajectory is separated from said unvarying k-space trajectory by a refocusing pulse.

12. The magnetic resonance imaging method of claim 9, wherein said varying k-space trajectory comprises several parts with interposed refocusing pulses and wherein said rectilinear k-space trajectory is separated from said varying k-space trajectory by a refocusing pulse.

13. The apparatus of claim 3 wherein said MRI machine further includes an amplifier, said amplifier being an RF amplifier that amplifies a signal provided by said signal generator and provides said amplified signal to said RF coil.

14. The apparatus of claim 3 wherein said MRI machine further includes a detector coupled to said RF coil, said detector being an RF detector that receives a signal from said sample in said volume via said RF coil, wherein said detector performs said signal read out of said transverse magnetization along said varying k-space trajectory for said segment.

15. The apparatus of claim 14 wherein said control system is configured to control said signal generator and said gradient waveform generator, said control system including:
data storage in communication with said detector to receive data from said detector, said data being stored as a data file that comprises information representative of an image and
a data output for providing said information representative of said image to a user.

* * * * *